(12) United States Patent
Wu

(10) Patent No.: US 7,830,004 B2
(45) Date of Patent: Nov. 9, 2010

(54) PACKAGING WITH BASE LAYERS COMPRISING ALLOY 42

(75) Inventor: Gene Wu, Dayuan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 347 days.

(21) Appl. No.: 11/588,481

(22) Filed: Oct. 27, 2006

(65) Prior Publication Data

US 2008/0099912 A1   May 1, 2008

(51) Int. Cl.
*H01L 23/06* (2006.01)
*H01L 23/14* (2006.01)

(52) U.S. Cl. ............ 257/729; 257/698; 257/700; 257/712; 257/713; 257/720; 257/758; 257/E23.005; 257/E23.006

(58) Field of Classification Search ......... 257/700, 257/729, 677, 712, 713, 720, 730, 738, E23.005, 257/E23.006, E23.019, E23.109, E23.11, 257/698, 758

See application file for complete search history.

(56) References Cited

U.S. PATENT DOCUMENTS

| | | | | |
|---|---|---|---|---|
| 6,351,031 | B1* | 2/2002 | Iijima et al. | 257/698 |
| 6,428,942 | B1 | 8/2002 | Jiang et al. | |
| 6,744,135 | B2* | 6/2004 | Hasebe et al. | 257/712 |
| 6,787,902 | B1 | 9/2004 | Survakumar | |
| 7,400,037 | B2* | 7/2008 | Yang et al. | 257/723 |
| 7,514,767 | B2* | 4/2009 | Yang | 257/666 |
| 2003/0122243 | A1* | 7/2003 | Lee et al. | 257/700 |
| 2004/0173901 | A1* | 9/2004 | Mallik et al. | 257/738 |
| 2004/0188825 | A1* | 9/2004 | Survakumar | 257/700 |
| 2004/0214373 | A1* | 10/2004 | Jiang et al. | 438/110 |
| 2006/0043568 | A1* | 3/2006 | Abe et al. | 257/698 |

* cited by examiner

*Primary Examiner*—Jerome Jackson, Jr.
*Assistant Examiner*—Yu Chen
(74) *Attorney, Agent, or Firm*—Slater & Matsil, L.L.P.

(57) ABSTRACT

A semiconductor packaging structure is provided. The structure includes a base layer comprising alloy 42; die attached on a first side of the base layer; and an interconnect structure on the die, wherein the interconnect structure comprises vias and conductive lines connected to the die.

23 Claims, 10 Drawing Sheets

PACKAGING WITH BASE LAYERS COMPRISING ALLOY 42

TECHNICAL FIELD

This invention relates generally to packaging of semiconductor chips, and more particularly to the structure and methods for embedding semiconductor chips into packages.

BACKGROUND

In the semiconductor industry, integrated circuits are typically formed on wafers, wherein a plurality of semiconductor chips on the same wafer is formed simultaneously. The semiconductor chips are then sawed from the wafers. Since semiconductor chips are typically small and fragile, they need to be packaged before being used.

FIG. 1 illustrates a conventional package, which includes a semiconductor chip (die) 2 bonded to a package substrate 4, for example, through solder bumps 6. Package substrate 4 includes a core 8 and a plurality of interconnect layers built up on both sides of core 8. Die 2 and core 8 are separated by interconnect layers. On a side of core 8 opposite the side where die 2 is attached, ball grid array (BGA) balls 10 are formed for connecting package substrate 4 to other electrical components, such as a motherboard. Die 2 and BGA balls 10 are electrically coupled through metal lines and vias formed in the interconnect layers. Vias 12 are formed in core 8 to make electrical connection from one side of core 8 to another.

The conventional packages suffer drawbacks. First, forming solder bumps 6 involves a high cost. The packaging process also suffers high yield lost due to failed solder bump connections. Second, die 2 typically has a coefficient of thermal expansion (CTE) of about 2.3 to 4.2. Core 8, on the other hand, is typically formed of bismaleimide triazine (BT), which has a CTE of about 15. The significant CTE mismatch causes stresses applied on die 2 and solder bumps 6, which, under thermal cycles, may cause warpage of die 2 and/or the failure of the solder bump connections. Third, due to the use of core 8, the thickness of the package is increased. The total thickness of the entire package, including BGA balls 10, package substrate 4 and die 2, may reach 2.3 mm, which will be too thick for future requirements. Therefore, new packaging structures and methods are needed.

SUMMARY OF THE INVENTION

In accordance with one aspect of the present invention, a semiconductor packaging structure is provided. The structure includes a base layer comprising alloy 42; a die attached on a first side of the base layer; and an interconnect structure on the die, wherein the interconnect structure comprises vias and conductive lines connected to the die.

In accordance with another aspect of the present invention, a semiconductor packaging structure includes a first base layer comprising alloy 42; a second base layer attached on a first side of the first base layer; an opening in the second base layer; a die in the opening and attached on the first side of the first base layer; a first dielectric layer on the die and the second base layer; by-vias in the first dielectric layer and in physical contact with the die; an interconnect structure on the first dielectric layer, and ball grid array (BGA) balls on a top surface of the interconnect structure. The interconnected structure comprises additional dielectric layers, and vias and conductive lines in the additional dielectric layers. At least portions of the vias and the conductive lines are connected to the by-vias.

An advantageous feature of the present invention is that alloy 42 has a similar coefficient of thermal expansion as semiconductor dies, and thus the stresses applied by package structures to dies are reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel packaging structure and methods for forming the same are provided. The intermediate stages of manufacturing an embodiment of the present invention are illustrated in FIGS. 2 through 10. Throughout the various views and illustrative embodiments of the present invention, like reference numbers are used to designate like elements.

Figure 1:
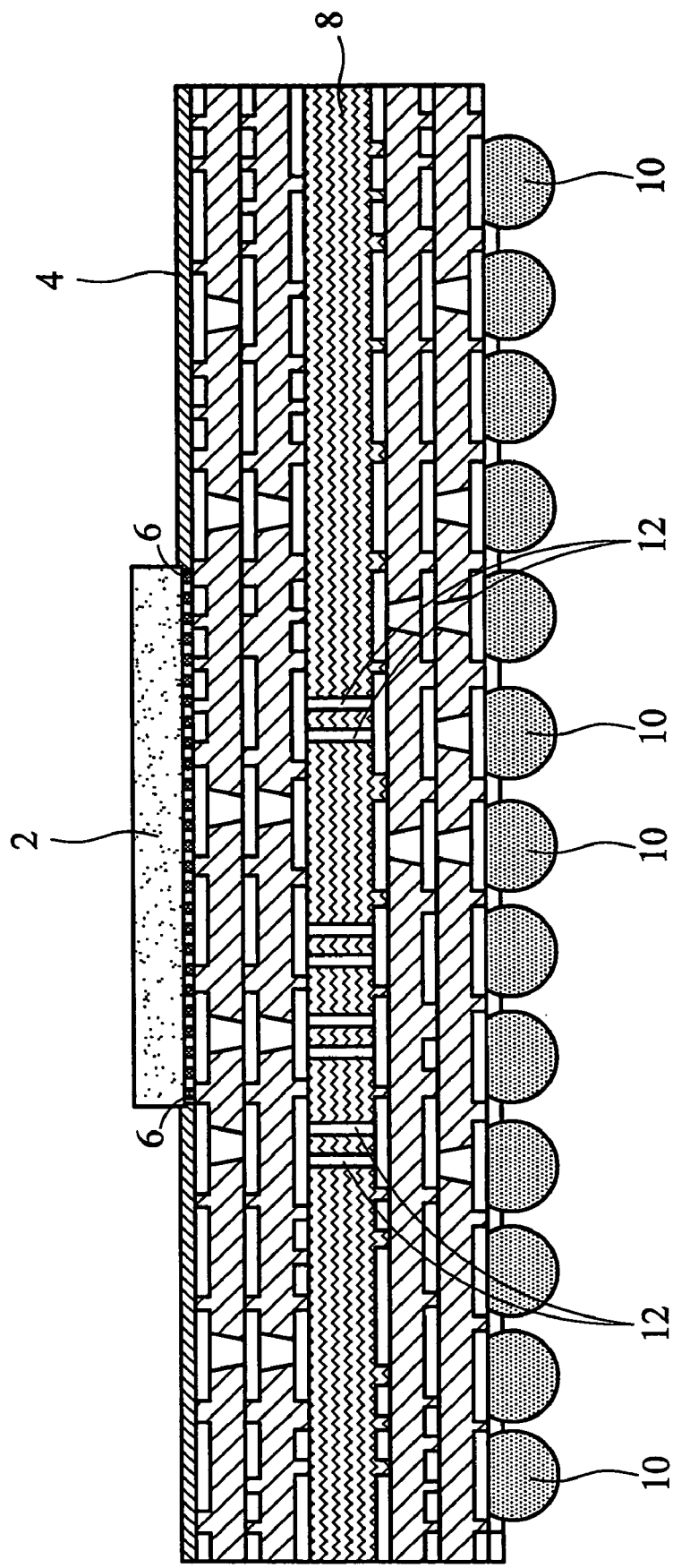
FIG. 1 illustrates a conventional package, wherein interconnect layers are formed on both sides of a core.
Figure 2:
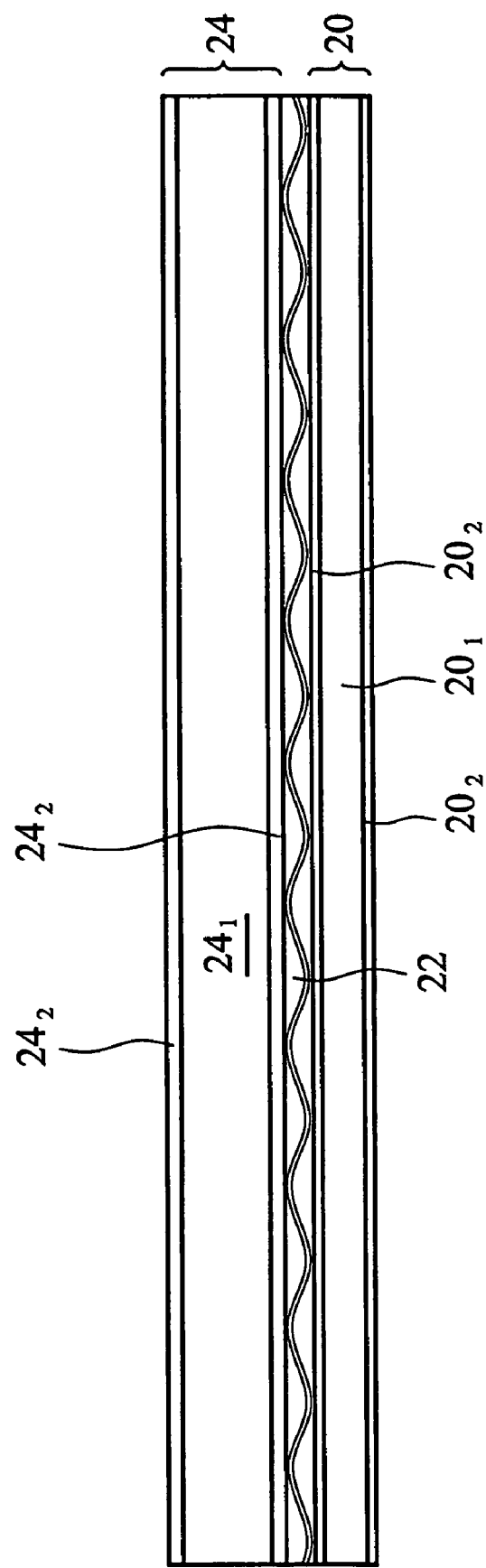
FIGS. 2 through 10 are cross-sectional views of intermediate stages in the manufacture of an embodiment of the present invention.

FIG. 2 illustrates a starting structure that includes base layer 20, base layer 24 and an adhesive material 22. In an embodiment, base layer 20 includes a core $20_1$ comprising "alloy 42," which is a nickel iron alloy that will be discussed in detail in subsequent paragraphs. In addition, two layers $20_2$ comprising copper may be plated on two sides of core $20_1$. Similarly, base layer 24 includes a core $24_1$ comprising alloy 42. In addition, two layers $24_2$ comprising copper, may be plated on two sides of core $20_2$.

Alloy 42 is an alloy comprising about 42 weight percent nickel and about 58 weight percent iron, wherein the numeral 42 refers to the percentage of nickel. Alloy 42 has an elastic modulus of about 20.7E6 pound per square inch (PSI), a CTE of about 4.0E-06/K to about 4.7E-06/K, a thermal conductivity of about 16 W/mK, and an electrical resistivity of about 70 μ-Ω·cm. Base layer 20 may have a thickness of about 4 mils, while base layer 24 may have a thickness of about 12 mils. Base layers 20 and 24 not only provide protection to a die attached through subsequent process steps, but also provide structural support. Base layers 20 and 24 may be bonded by an adhesive material 22, such as prepreg, which may be followed by a laminating press. Although base layers 20 and 24 are referred to as alloy 42 layers, they may comprise alloys with slightly different compositions of, but with similar CTEs, as alloy 42.

Figure 3:
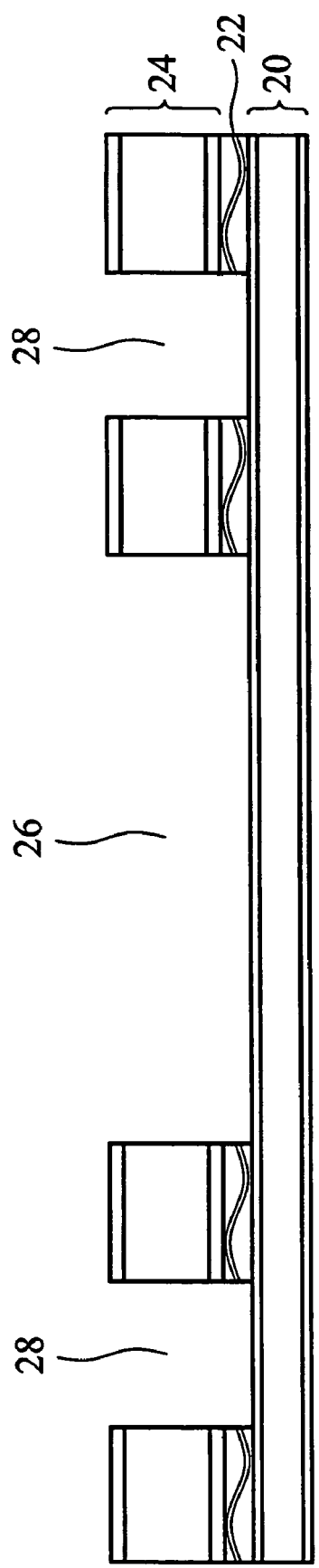

Referring to FIG. 3, openings 26 and 28 are formed by removing portions of base layer 24 and adhesive material 22. Opening 26 is designated for placing a die, thus its size is determined accordingly by the size of the die. Openings 28 are optionally formed for placing electrical components that may be integrated into the substrate package, for example, passive devices including capacitors. Alternatively, openings 26 and 28 may be pre-formed before base layer 24 is attached to base layer 20.

Figure 4:
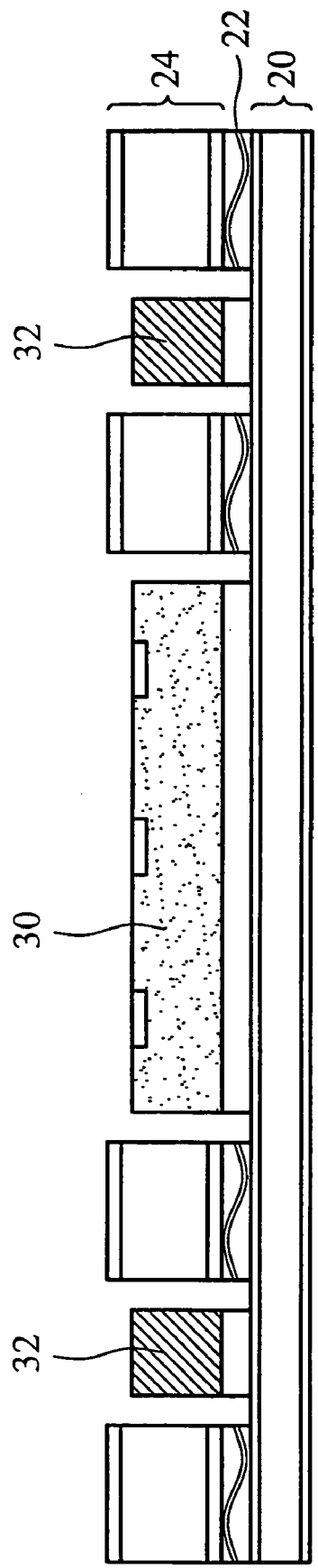

In FIG. 4, die 30 is placed into opening 26 and attached to base layer 20, preferably by an adhesive such as silver paste. Electrical components 32 are also placed into openings 28 and attached to base layer 20.

Figure 5:
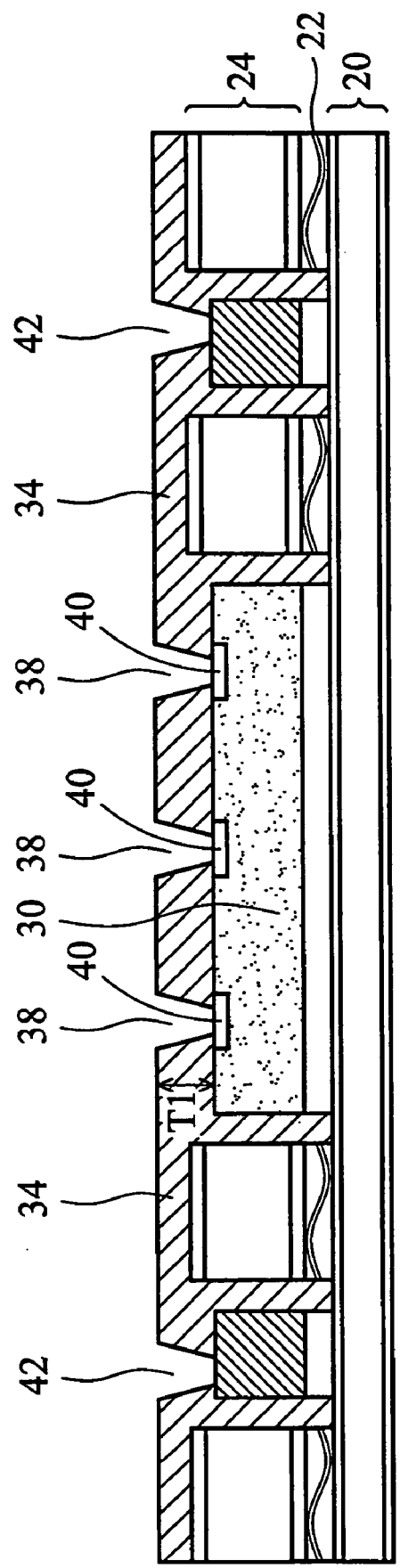

Referring to FIG. 5, dielectric layer 34 is formed on the previously formed structure. In the preferred embodiment, dielectric layer 34 comprises an organic material such as Ajinomoto buildup film (ABF). However, other common materials such as Prepreg and resin coated copper (RCC) can be used. In the case in which dielectric layer 34 is formed of ABF, an ABF film is laminated on the structure shown in FIG. 4. Heat and pressure may be applied to the laminated film to soften it so that a flat-top surface is formed. The heat and pressure also helps dielectric layer material 34 to fill into the spaces between die 30 (as well as electrical components 32) and base layer 24. In the resulting structure, a thickness T1 between a top surface of die 30 and a top surface of dielectric layer 34 is preferably about 30 μm and about 35 μm, and more preferably about 30 μm.

Openings 38 are then formed to expose contact pads (also referred to as under bump metallurgy, or UBM) 40 on the top surface of die 30. Preferably, openings 38 are formed by laser drilling, wherein the portions of dielectric layer 34 over UBMs 40 are burned. Also, opening 42 may be formed to expose contact pads (not shown) of electrical components 32.

Figure 6:
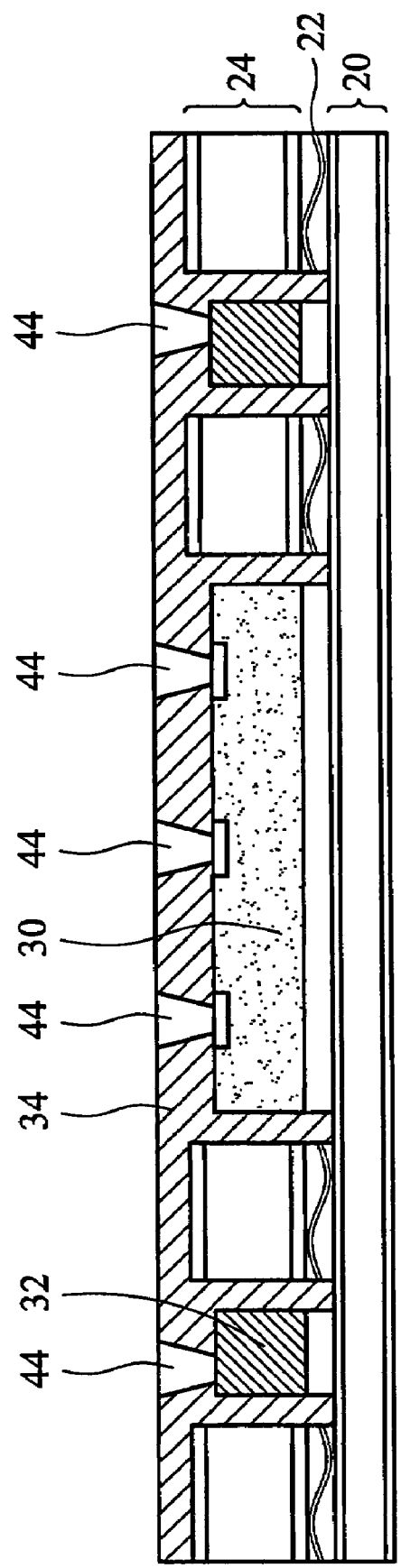

FIG. 6 illustrates the formation of by-vias 44 by selectively filling conductive materials into openings 38 and 42. The conductive materials may be any commonly used conductive materials. In an embodiment, the conductive material includes copper or copper alloys, although other metals such as aluminum and silver may also be used. The filling methods include electroless plating and electroplating. By-vias 44 directly connect UBMs 40 and the overlying interconnect structure formed in subsequent steps. Therefore, no solder bumps are needed. By-vias 44 also connect electrical components 32 with the interconnect structure. Preferably, by-vias 44 have top surfaces substantially level with the top surface of dielectric layer 34. Alternatively, the top surfaces of by-vias 44 are slightly lower than the top surface of dielectric layer 34.

Figure 7:
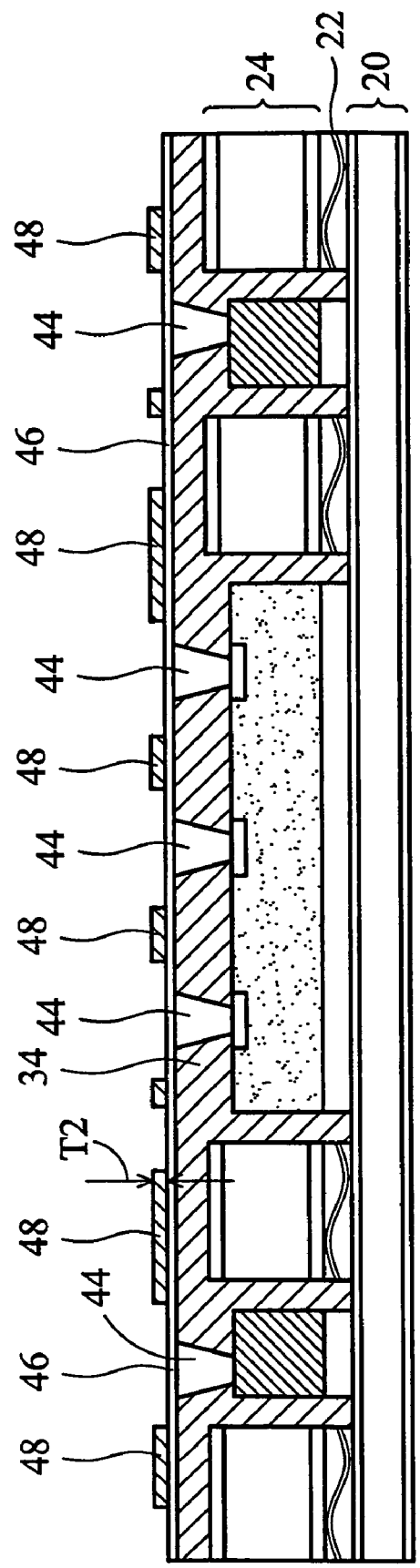

Referring to FIG. 7, a thin seed layer 46, preferably comprising copper, is formed on the surfaces of dielectric layer 34 and by-vias 44, wherein electroless plating is preferably performed. Thin seed layer 46 preferably has a thickness of less than about 0.8 μm. Dry film 48 is then formed on seed layer 46, followed by a patterning process, which forms openings in which metal lines are to be formed. The thickness of dry film 48 is preferably determined accordingly by the thickness of the subsequently formed conductive lines. In an exemplary embodiment, thickness T2 of dry film 48 is between about 20 μm and about 25 μm, and more preferably about 20 μm.

Figure 8:
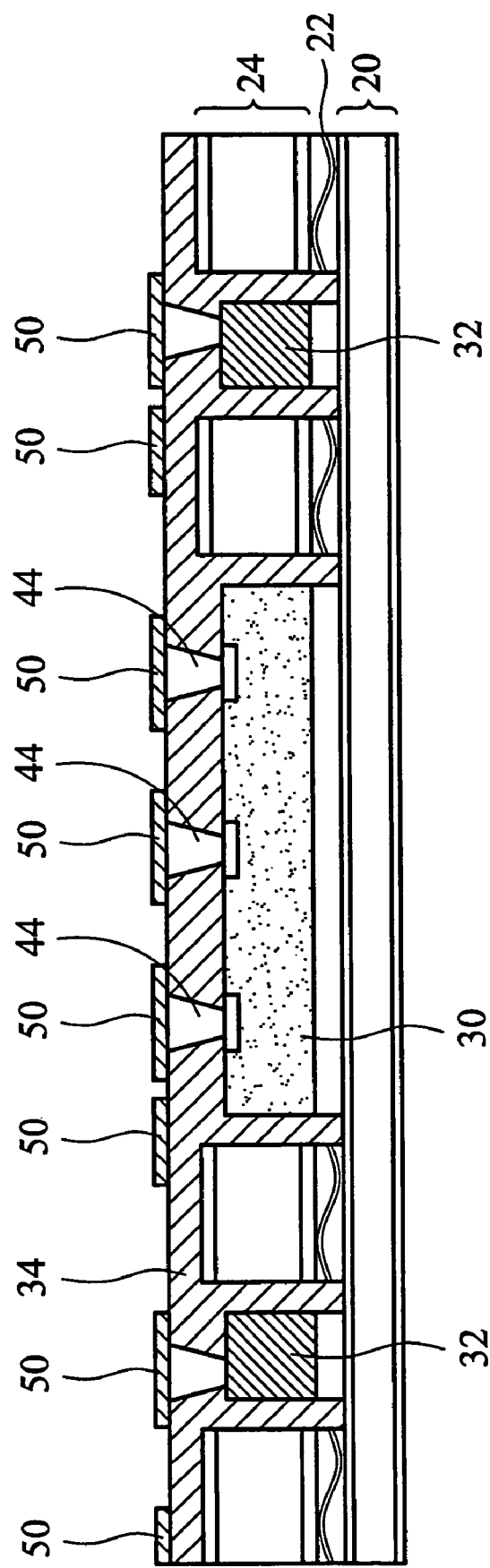

Referring to FIG. 8, conductive patterns 50, which may include conductive lines and pads, are formed, for example, by selectively electroplating on the portions of the seed layer 46 not covered by dry film 48. Conductive patterns 50 are preferably formed to a thickness substantially close to the thickness of dry film 48. Conductive patterns 50 are preferably formed of copper or copper alloys, although other commonly used metals such as silver, aluminum and nickel can also be used. Top surfaces of the conductive patterns 50 are preferably level with, although they may be slightly lower than, the top surface of dry film 48. After the formation of conductive patterns 50, dry film 48 and the portions of seed layer 46 underlying dry film 48 are removed. In an exemplary embodiment, dry film 48 is removed in an alkaline solution, and the portions of seed layer 46 under dry film 48 are removed by a flash etching. As a side effect, a thin layer is also removed from conductive patterns 50 by the flash etching.

Figure 9:
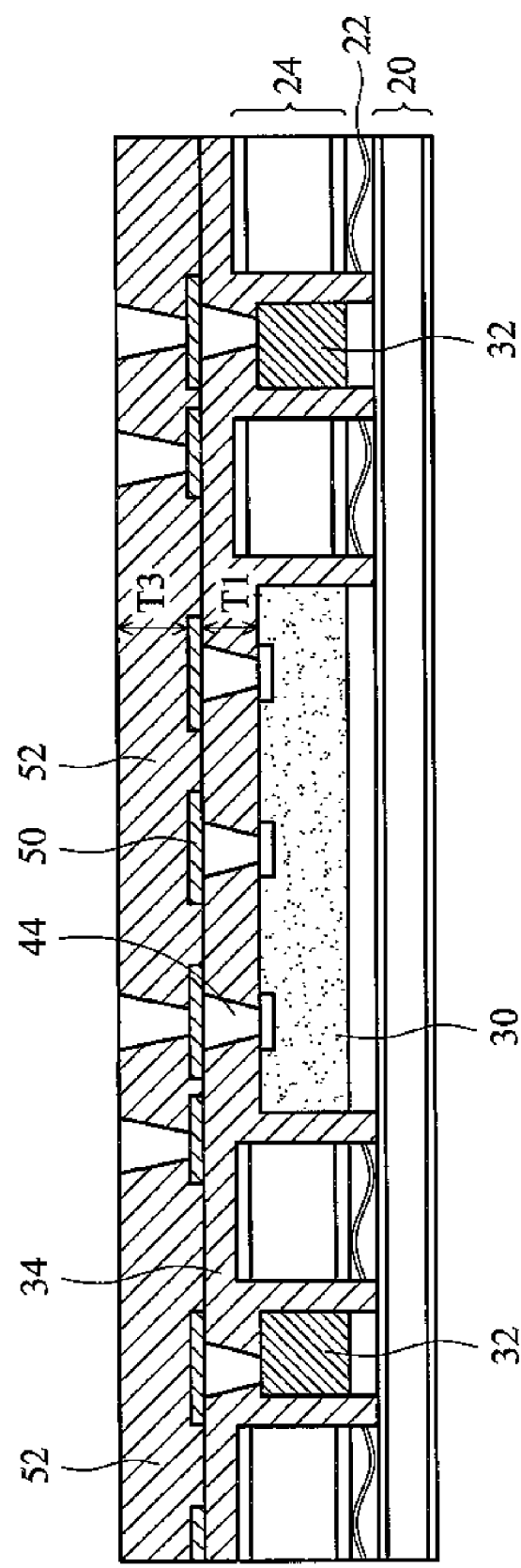

Referring to FIG. 9, dielectric layer 52 is blanket formed, which may be formed of essentially the same materials and using essentially same methods as dielectric layer 34. A thickness T3 from a top surface of conductive patterns 50 to a top surface of dielectric layer 52 is preferably close to thickness T1, which may be about 30 μm.

Figure 10:
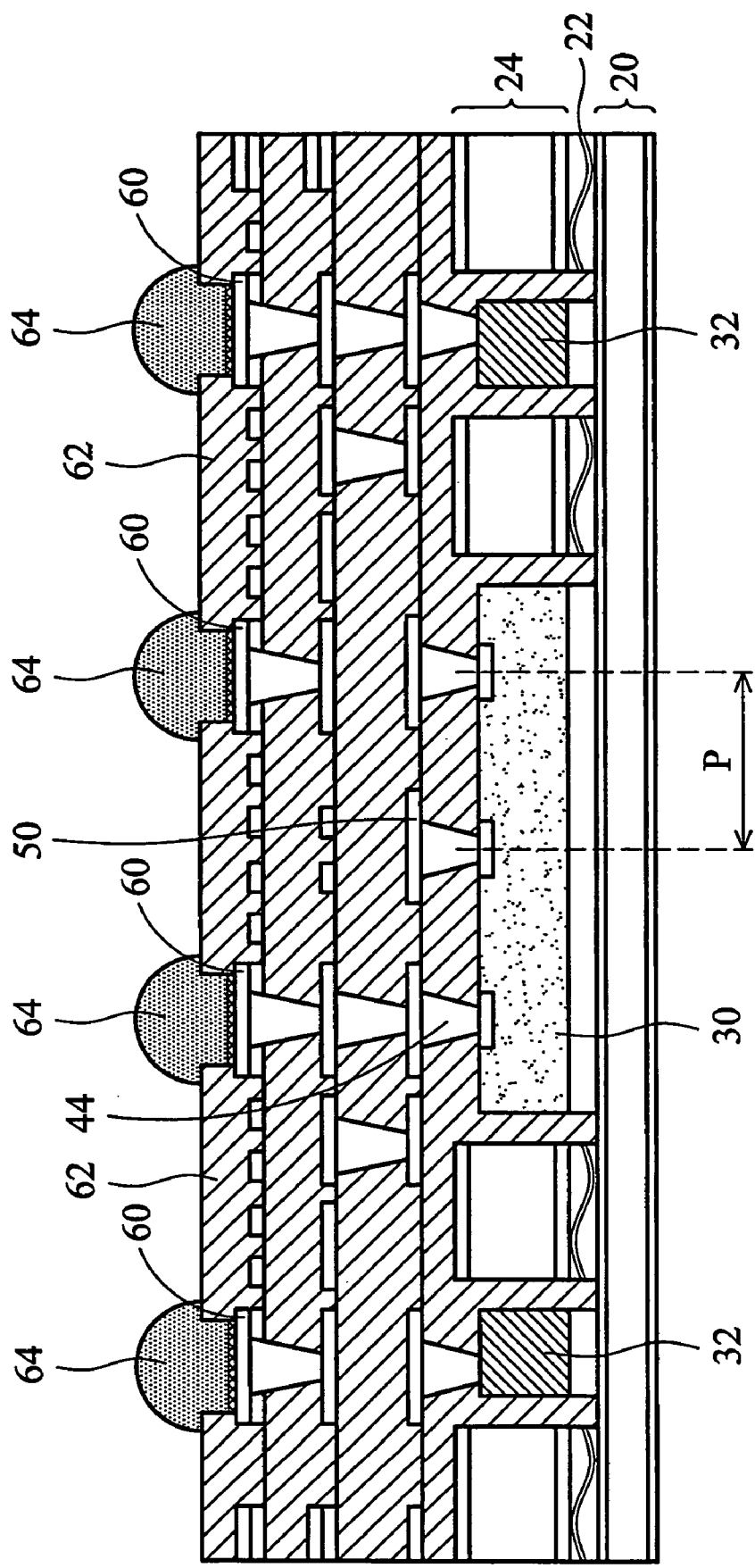

Processes are then continued to form more interconnect layers including by-vias and conductive patterns, and the resulting structure is shown in FIG. 10. For each interconnect layer, the process steps may be essentially the same as forming by-vias 44 and conductive patterns 50. Preferably, three to five interconnect layers (including the interconnect layer comprising by-vias 44 and conductive patterns 50) may be formed, wherein each interconnect layer includes a layer of conductive patterns and underlying by-vias.

In alternative embodiments, other known methods, for example, damascene processes, can be used to form the interconnect layers. As is known in the art, damascene processes typically include the steps of forming a dielectric layer, forming openings in the dielectric layer, filling the openings with a conductive material such as copper or copper alloys, and performing a chemical mechanical polish to remove excess conductive material. The remaining portions of the conductive material form by-vias and conductive patterns.

Referring again to FIG. 10, bump pads 60 may be formed in the top interconnect layer. A solder mask 62 (also referred to as solder resist) is formed, which may have a thickness of about 20 μm. Solder resist openings (SRO) are then formed, exposing underlying bump pads 60. Ball grid array (BGA) balls 64 are then formed on bump pads 60. The details for forming solder bumps 60, solder mask 62 and BGA balls 64 are well known in the art, thus are not repeated herein. The package substrate with the/an embedded die can then be attached to a motherboard through BGA balls 64.

An advantageous feature of using alloy 42 as the base layer is that alloy 42 has a coefficient of thermal expansion (CTE) of between about 4.0 E-06/K and about 4.7 E-06/K, matching well with the CTEs of typical dies (typically between about 2.3 E-06/K and about 4.2 E-06/K). Under thermal cycles, the stresses applied to a/the die by base layers 20 and 24 are thus minimized. As a comparison, a conventional core material, which typically includes bismaleimide triazine (BT), is 15 E-06/K. Therefore, high stresses are applied to dies packaged onto package substrates with BT cores. Simulation results reveal that a package substrate having a conventional BT core (with a thickness of about 100 μm) will cause the laminate (for example, ABF film) warpage of about 125 μm, while the embodiments of the present invention only have a warpage of about 40 μm. The reliability of packages is thus improved.

The embodiments of the present invention have several other advantageous features. Due to the removal of the core from the package substrate, electrical signals are routed through interconnect layers more efficiently, and less space in interconnect layers is wasted. Accordingly, the number of interconnect layers may be reduced from eight layers in conventional package substrates to five layers, and even three layers in the present invention. The thickness of the overall package substrate is also reduced accordingly, to, for example, between about 26 mils and about 30 mils. In addition, the removal of cores from the middle of the interconnect layers will reduce the package inductances and insertion losses.

A further advantageous feature of the present invention is that due to the fact that vias 44 is directly connected to die 30, and thus no solder resist is needed, pitch P (refer to FIG. 10) of die 30 may be reduced. In an exemplary embodiment, pitch P is about 120 μm. In conventional package structures, however, solder bumps are used for connecting dies and packages substrates. Correspondingly, the minimum pitches are at least 140 μm.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor packaging structure comprising:
a base layer comprising a base core, wherein the base core comprises alloy 42 and is plated on at least one side by a metal;
an additional base layer comprising alloy 42 on a first side of the base layer and not integral to the base layer;
a die attached on the first side of the base layer, wherein the die is in an opening in the additional base layer; and
an interconnect structure on the die, wherein the interconnect structure comprises vias adjoining and directly connected to the die, and conductive lines connected to the die.

2. The semiconductor packaging structure of claim 1 further comprising ball grid array balls on a top surface of the interconnect structure and connected to the die through the interconnect structure.

3. The semiconductor packaging structure of claim 1 further comprising additional electrical components attached on the first side of the base layer and connected to the interconnect structure.

4. The semiconductor packaging structure of claim 1, wherein connections between the interconnect structure and the die are free from solder bumps.

5. The semiconductor packaging structure of claim 1, wherein the interconnect structure comprises less than six interconnect layers.

6. The semiconductor packaging structure of claim 1, wherein a second side of the base layer opposite the first side is free from interconnect structures.

7. The semiconductor packaging structure of claim 1, wherein a second side of the base layer opposite the first side is free from dies.

8. The semiconductor packaging structure of claim 1, wherein the interconnect structure is free from cores.

9. A semiconductor packaging structure comprising:
a first base layer comprising a base core, wherein the base core comprises alloy 42 and is plated on at least one side by a metal;
a second base layer attached on a first side of the first base layer, wherein the second base layer comprises alloy 42 and is not integral to the first base layer;
an opening in the second base layer;
a die in the opening and attached on the first side of the first base layer;
a first dielectric layer on the die and the second base layer;
by-vias in the first dielectric layer and in physical contact with the die;
an interconnect structure on the first dielectric layer, wherein the interconnect structure comprises additional dielectric layers, and vias and conductive lines in the additional dielectric layers, and wherein at least portions of the vias and the conductive lines are connected to the by-vias; and
ball grid array (BGA) balls on a top surface of the interconnect structure.

10. The semiconductor packaging structure of claim 9, wherein the first dielectric layer comprises Ajinomoto buildup film (ABF).

11. The semiconductor packaging structure of claim 9, wherein a top surface of the BGA balls to a bottom surface of the first base layer have a thickness of less than about 45 mils.

12. The semiconductor packaging structure of claim 9 further comprising additional electrical components attached to the first side of the first base layer and connected to the interconnect structure through additional by-vias, wherein connections between the interconnect structure and the additional by-vias are free from solder bumps.

13. The semiconductor packaging structure of claim 9, wherein connections between the interconnect structure and the die are free from solder bumps.

14. The semiconductor packaging structure of claim 9, wherein the interconnect structure comprises less than six interconnect layers.

15. The semiconductor packaging structure of claim 9, wherein a second side of the first base layer opposite the first side is free from interconnect structures.

16. The semiconductor packaging structure of claim 9, wherein a second side of the first base layer opposite the first side is free from dies.

17. The semiconductor packaging structure of claim 9, wherein structures between the BGA balls and the second base layer are free from cores.

18. A semiconductor packaging structure comprising:
a first base layer comprising a first base core comprising alloy 42;
a second base layer comprising a second base core comprising alloy 42, wherein the second base layer is on a first side of the first base layer and is not integral to the first base layer;
a die attached on the first side of the first base layer and in an opening in the second base layer; and
an interconnect structure on the die, wherein the interconnect structure comprises vias and conductive lines connected to the die and by-vias directly connected to the die.

19. The semiconductor packaging structure of claim 18 further comprising ball grid array balls on a top surface of the interconnect structure and connected to the die through the interconnect structure.

20. The semiconductor packaging structure of claim 18, wherein connections between the interconnect structure and the die are free from solder bumps and wire bonds.

21. The semiconductor packaging structure of claim 18, wherein a second side of the first base layer opposite the first side is free from interconnect structures.

22. The semiconductor packaging structure of claim 18, wherein a second side of the first base layer opposite the first side is free from dies.

23. The semiconductor packaging structure of claim 18, wherein the interconnect structure is free from cores.

* * * * *